(12) United States Patent
Kim et al.

(10) Patent No.: US 8,237,509 B2
(45) Date of Patent: Aug. 7, 2012

(54) AMPLIFIER WITH INTEGRATED FILTER

(75) Inventors: Tae Wook Kim, Austin, TX (US); Guy Klemens, San Diego, CA (US); Kenneth Charles Barnett, Austin, TX (US); Susanta Sangupta, Leander, TX (US); Gurkanwal Singh Sahota, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 122 days.

(21) Appl. No.: 11/852,946

(22) Filed: Sep. 10, 2007

(65) Prior Publication Data

US 2008/0204148 A1  Aug. 28, 2008

Related U.S. Application Data

(60) Provisional application No. 60/891,258, filed on Feb. 23, 2007, provisional application No. 60/909,406, filed on Mar. 30, 2007.

(51) Int. Cl.
*H03F 3/04* (2006.01)
(52) U.S. Cl. ...................... 330/306; 330/124 R; 330/253
(58) Field of Classification Search .................. 330/306, 330/124 R, 253
See application file for complete search history.

(56) References Cited

U.S. PATENT DOCUMENTS

| | | | | |
|---|---|---|---|---|
| 4,875,019 A * | 10/1989 | Monson et al. | ................ | 330/302 |
| 5,434,544 A * | 7/1995 | Van Veenendaal | ........ | 331/117 R |
| 6,232,848 B1 | 5/2001 | Manku | | |
| 6,681,103 B1 * | 1/2004 | Rogers et al. | ................. | 455/302 |
| 6,762,596 B2 * | 7/2004 | Yokogawa et al. | ........... | 323/316 |
| 6,778,017 B2 * | 8/2004 | Analui et al. | ................. | 330/292 |
| 6,888,408 B2 * | 5/2005 | Furst et al. | .................... | 330/277 |
| 7,176,758 B2 * | 2/2007 | Rein et al. | ..................... | 330/252 |
| 7,187,916 B2 * | 3/2007 | Mo et al. | ....................... | 455/323 |
| 7,315,211 B1 * | 1/2008 | Lee et al. | ...................... | 330/285 |
| 2004/0130392 A1 | 7/2004 | Saito | | |

FOREIGN PATENT DOCUMENTS

EP  1523094  4/2005
(Continued)

OTHER PUBLICATIONS

International Search Report and Written Opinion—PCT/US08/054463, International Search Authority—European Patent Office—Jun. 10, 2008.

(Continued)

*Primary Examiner* — Patricia Nguyen
(74) *Attorney, Agent, or Firm* — Larry J. Moskowitz; Ramin Mobarhan

(57) ABSTRACT

An amplifier with integrated filter (e.g., an LNA) is described. In one design, the amplifier may include a gain stage, a filter stage, and a buffer stage. The gain stage may provide signal amplification for an input signal. The filter stage may provide filtering for the input signal. The buffer stage may buffer a filtered signal from the filter stage. The amplifier may further include a second filter stage and a second buffer stage. The second filter stage may provide additional filtering for the input signal. The second buffer stage may buffer a second filtered signal from the second filter stage. All of the stages may be stacked and coupled between a supply voltage and circuit ground. The filter stage(s) may implement an elliptical lowpass filter. Each filter stage may include an inductor and a capacitor coupled in parallel and forming a resonator tank to attenuate interfering signals.

20 Claims, 12 Drawing Sheets

FOREIGN PATENT DOCUMENTS

| | | |
|---|---|---|
| JP | 6164314 A | 6/1994 |
| JP | 08023270 | 1/1996 |
| JP | 2000223963 A | 8/2000 |
| JP | 2004015409 A | 1/2004 |
| JP | 2004153378 A | 5/2004 |
| JP | 2007531472 A | 11/2007 |
| WO | WO03079543 | 9/2003 |
| WO | WO03107531 A1 | 12/2003 |

OTHER PUBLICATIONS

Daasch et al., "Automatic Generation of CMOS Continuous-Time Elliptic Filters" Electronics Letters, IEE Stevenage, GB, vol. 28, No. 24, Nov. 19, 1992, pp. 2215-2216, XP000322184 ISSN: 0013-5194 p. 2215, right-hand column, lines 1-4.

Gramegna et al., "An 8.2-ghz, 14.4mw, 1.6db of sige bipolar lna with dc current reuse" Proceedings of The 2003 Bipolar/BICMOS Circuits and Technology Meeting. (BCTM). Toulouse, France, Sep. 28-30, 2003; [IEEE Bipolar/BICMOS Circuits and Technology Meeting], New York, NY: IEEE, US, Sep. 28, 2003, pp. 49-52, XP010688453 ISBN: 978-0-78037800-1 p. 49, left-hand column, line 26—p. 51, left-hand column, line 14; figures 1,4.

Townsend et al., "Ultra-Wideband Front-End With Tunable Notch Filter" North-East Workshop on Circuits and Systems, 2006 IEEE, IEEE, PI, Jun. 1, 2006, pp. 177-180, XP.031019377 ISBN: 978-01-4244-0416-2 p. 177, right-hand column, line 5—p. 179, left-hand column, line 17; figures 2, 5.

Zhiqun et al., "Image Rejection Low Noise Amplifier for WLAN 802.11a Application," Microwave Conference Proceedings, 2005, Asia-Pacific Conference Proceedings, Suzhou, China Dec. 4-7, 2005, Piscataway, NJ, USA, IEEE vol. 5, Dec. 4, 2005, pp. 1-4. XP010902467 ISBN: 978-0-7803-9433-9 p. 1, left-handed column, left-hand column, line 16; figures 1-3.

\* cited by examiner

AMPLIFIER WITH INTEGRATED FILTER

CLAIM OF PRIORITY UNDER 35 U.S.C. §119

The present Application for Patent claims priority to Provisional Application Ser. No. 60/891,258, entitled "INTEGRATED INTER-STAGE OUT-OF-BAND INTERFERER REJECTION FILTER FOR WIDEBAND AMPLIFIER," filed Feb. 23, 2007, and Ser. No. 60/909,406, entitled "INTEGRATED INTER-STAGE OUT-OF-BAND INTERFERER REJECTION FILTER FOR WIDEBAND AMPLIFIER," filed Mar. 30, 2007, both assigned to the assignee hereof, and expressly incorporated herein by reference.

BACKGROUND

I. Field

The present disclosure relates generally to circuits, and more specifically to amplifier.

II. Background

Amplifiers are commonly used in various electronics devices to provide signal amplification. Different types of amplifiers are available for different uses. For example, a wireless device such as a cellular phone may include a transmitter and a receiver for bi-directional communication. The transmitter may utilize a power amplifier (PA), the receiver may utilize a low noise amplifier (LNA), and the transmitter and receiver may utilize variable gain amplifiers (VGAs).

An LNA is commonly used in a receiver to amplify a low-amplitude signal received via a communication channel. The LNA is often the first active circuit encountered by the received signal and hence has a large impact on the performance of the receiver in several key areas. First, the LNA has a large influence on noise performance since the noise of the LNA is injected directly into the received signal and the noise of subsequent stages is effectively reduced by the gain of the LNA. Second, the LNA should be able to handle large interfering signals (or jammers) that may come from external and/or internal sources. These interfering signals may cause intermodulation distortion, which may fall within the desired signal bandwidth and degrade receiver performance.

There is therefore a need in the art for an amplifier with good noise performance and capable of handling large interfering signals.

SUMMARY

An amplifier with integrated filter and having good noise performance and capable of handling large interfering signals are described herein. In one design, the amplifier with integrated filter (e.g., an LNA) may include a gain stage and a filter stage. The gain stage may provide signal amplification for an input signal. The filter stage may be coupled to the gain stage and may provide filtering for the input signal to attenuate the interfering signals. The amplifier may further include a buffer stage that may be coupled to the filter stage and used to buffer a filtered signal from the filter stage. The gain stage, filter stage, and buffer stage may be stacked and coupled between a supply voltage and circuit ground.

The amplifier may further include a second filter stage and a second buffer stage. The second filter stage may be coupled to the buffer stage and may provide additional filtering for the input signal to further attenuate the interfering signals. The second buffer stage may be coupled to the second filter stage and used to buffer a second filtered signal from the second filter stage. All of the stages may be stacked and coupled between the supply voltage and circuit ground.

The filter stage(s) may implement an elliptical lowpass filter or some other type of filter. Each filter stage may include an inductor and a capacitor, which may be coupled in parallel to form a resonator tank. This tank may pass a desired signal and attenuate the interfering signals. Each filter stage may further include a shunt capacitor coupled to one end (or each end) of the inductor to form a low impedance path at high frequencies.

The amplifier with integrated filter may be implemented with a single-ended design or a differential design. Various aspects and features of the disclosure are described in further detail below.

DETAILED DESCRIPTION

The amplifier with integrated filter described herein may be used for various electronics devices such as broadcast receivers, cellular phones, personal digital assistants (PDAs), handheld devices, wireless modems, laptop computers, cordless phones, consumer electronics devices, etc. The amplifier may also be used for various communication systems such as Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, wireless local area networks (WLANs), broadcast systems, satellite positioning systems, etc.

For clarity, the use of the amplifier with integrated filter in a broadcast receiver is described below. The broadcast receiver may support MediaFLO™, Digital Video Broadcasting for Handhelds (DVB-H), Integrated Services Digital Broadcasting for Terrestrial Television Broadcasting (ISDB-T), and/or other terrestrial broadcast systems. A MediaFLO™ system may operate with a 6 megaHertz (MHz) bandwidth in a frequency range of 698 to 746 MHz. A DVB-H system may operate with a 5, 6, 7 or 8 MHz bandwidth in a frequency range of 470 to 860 MHz. An ISDB-T system may operate with a 6 MHz bandwidth in a frequency range of 470 to 770 MHz. MediaFLO™ is described in a document TIA-1099, entitled "Forward Link Only Air Interface Specification for Terrestrial Mobile Multimedia Multicast," dated August 2006. DVB-H is described in a document ETSI EN 300 744, entitled "Digital Video Broadcasting (DVB); Framing Structure, Channel Coding and Modulation for Digital Terrestrial Television," dated November 2004. ISDB-T is described in a document ARIB STD-B31, entitled "Transmission System for Digital Terrestrial Television Broadcasting," dated July 2003. These documents are publicly available.

Figure 1:
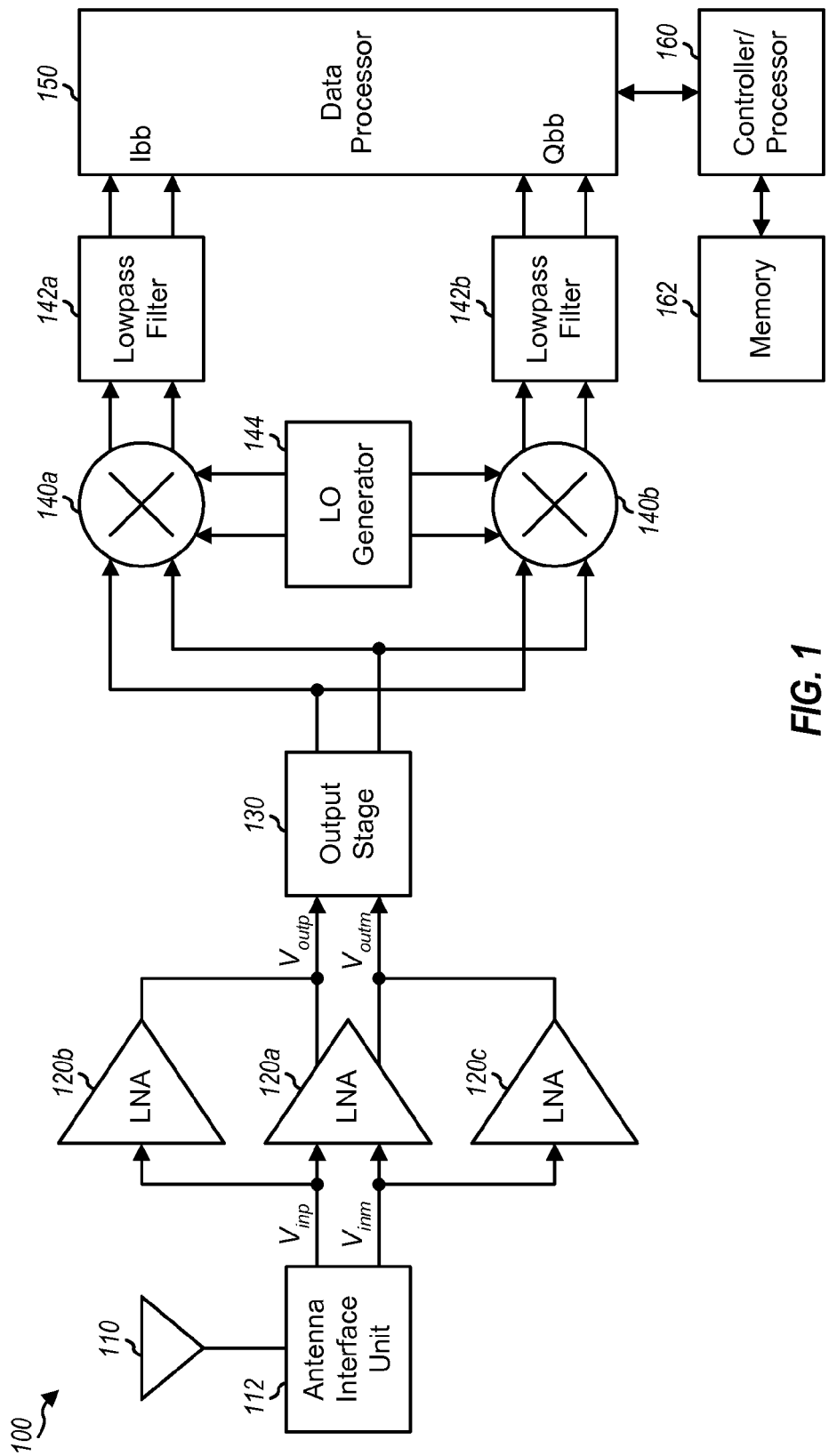
FIG. 1 shows a block diagram of a broadcast receiver.

FIG. 1 shows a block diagram of a design of a broadcast receiver 100. In this design, broadcast receiver 100 includes three LNAs 120a, 120b and 120c that may be used for multiple frequency bands and multiple modes. In one design, LNA 120a supports DVB-H and/or ISDB-T, LNA 120b supports high band MediaFLO™ from 719 to 746 MHz, and LNA 120c supports low band MediaFLO™ from 698 to 719 MHz. In general, a receiver may include any number of LNAs for any number of frequency bands and any number of modes. Each LNA may support one or more modes and one or more frequency bands.

A receiver may be implemented with a super-heterodyne architecture or a direct-conversion architecture. In the super-heterodyne architecture, a received signal is downconverted from radio frequency (RF) to baseband in multiple stages, e.g., from RF to an intermediate frequency (IF) in one stage, and then from IF to baseband in another stage. In the direct-conversion architecture, which is also referred to as a zero-IF architecture, a received signal is downconverted from RF to baseband in one stage. The super-heterodyne and direct-conversion architectures may use different circuit blocks and/or have different requirements. The following description assumes that broadcast receiver 100 implements the direct-conversion architecture.

In broadcast receiver 100, an antenna 110 receives broadcast signals from broadcast stations and provides a received signal to an antenna interface unit 112. Unit 112 may include one or more switches, filters, baluns, etc. Each filter may pass signal components in a designated frequency range and may be implemented with a surface acoustic wave (SAW) filter, a ceramic filter, or some other type of filter. If multiple filters are present within unit 112, then one of the filters may be selected for use, and a switch may couple antenna 110 to the selected filter. A balun may be used for single-ended to differential conversion, impedance transformation, filtering, etc.

In the design shown in FIG. 1, LNA 120a is a differential amplifier whereas LNAs 120b and 120c are single-ended amplifiers. In general, the choice of single-ended or differential design for each LNA may be made based on system requirements and/or other considerations such as design complexity, power consumption, cost, etc. When a DVB-H or ISDB-T mode is selected, unit 112 may process the received signal and provide a differential LNA input signal on lines $V_{inp}$ and $V_{inm}$. LNA 120a may amplify the differential LNA input signal and provide a differential LNA output signal on lines $V_{outp}$ and $V_{outm}$. When a high band MediaFLO™ mode is selected, unit 112 may process the received signal and provide a single-ended LNA input signal on line $V_{inp}$. LNA 120b may amplify the LNA input signal and provide an LNA output signal on line $V_{outp}$. When a low band MediaFLO™ mode is selected, unit 112 may process the received signal and provide a single-ended LNA input signal on line $V_{inm}$. LNA 120c may amplify the LNA input signal and provide an LNA output signal on line $V_{outm}$.

An output stage 130 may receive the LNA output signal on line $V_{outp}$ and/or line $V_{outm}$ and may provide a differential conditioned signal to mixers 140a and 140b. Output stage 130 may include a balun for single-ended to differential conversion and one or more programmable attenuators, buffers, amplifiers, etc. Mixer 140a may downconvert the conditioned signal with an inphase (I) local oscillator (LO) signal from an LO generator 144 and provide an I downconverted signal. A lowpass filter 142a may filter the I downconverted signal and provide an I baseband signal (Ibb) to a data processor 150. Similarly, mixer 140b may downconvert the conditioned signal from output stage 130 with a quadrature (Q) LO signal from LO generator 144 and provide a Q downconverted signal. A lowpass filter 142b may filter the Q downconverted signal and provide a Q baseband signal (Qbb) to data processor 150.

LO generator 144 may generate the I and Q LO signals for mixers 140a and 140b, respectively. LO generator 144 may include one or more voltage controlled oscillators (VCOs), phase locked loops (PLLs), reference oscillators, etc.

FIG. 1 shows an example receiver design. In general, the conditioning of the signals in a receiver may be performed by one or more amplifiers, filters, mixers, etc. These circuit blocks may be arranged differently from the configuration shown in FIG. 1. Furthermore, other circuit blocks not shown in FIG. 1 may be used to condition the signals in the receiver. All or a portion of the receiver may be implemented on one or more RF integrated circuits (RFICs), mixed-signal ICs, etc. For example, LNAs 120a, 120b and 120c and the subsequent analog circuits in broadcast receiver 100 may be implemented in a Universal Broadcast Modem (UBM) chip.

Data processor 150 may include various processing units for data reception and other functions. For example, data processor 150 may include a digital signal processor (DSP), a reduced instruction set computer (RISC) processor, a central processing unit (CPU), etc. A controller/processor 160 may control the operation at broadcast receiver 100. Memory 162 may store program codes and data for broadcast receiver 100. Data processor 150, controller/processor 160, and/or memory 162 may be implemented on one or more application specific integrated circuits (ASICs) and/or other ICs.

The received signal from antenna 110 may include a desired signal as well as interfering signals, which may be from other communication systems such as Global System for Mobile Communications (GSM), Universal Mobile Telecommunication System (UMTS), WLAN, etc. LNA 120a, 120b or 120c may amplify the received signal and provide an amplified signal via output stage 130 to mixers 140a and 140b. Mixers 140a and 140b may downconvert the amplified signal with LO signals having a fundamental frequency of $f_{LO}$, which may be the center frequency of the desired signal. The desired signal may then be downconverted to baseband by the fundamental frequency of the LO signals. However, interfering signals located near a third harmonic of the LO signals (or $3f_{LO}$) and a fifth harmonic of the LO signals (or $5f_{LO}$) may also be downconverted and may fall within the desired signal bandwidth. Inband distortion components due to reciprocal mixing of the harmonics of the LO signals may degrade receiver performance.

An interfering signal may be much larger than the desired signal and may be especially strong if the interfering signal comes from a transmitter that is co-located with receiver 100, which may be the case in a multi-purpose wireless device. A large interfering signal that is downconverted into the desired signal bandwidth may "swamp out" the desired signal. This desensitization of the desired signal caused by intermodulation distortion is commonly known as "blocking".

The potential adverse effect due to large interfering signals may be combated in several manners. First, the received signal may be filtered prior to being passed to an LNA. However, this pre-LNA filtering may also attenuate the desired signal and degrade noise performance. Furthermore, the pre-LNA filtering may not be able to provide sufficient attenuation of large interfering signals. Second, the mixers may be designed with high linearity in order to reduce the magnitude of distortion components due to reciprocal mixing of the LO harmonics. However, high linearity requirements may complicate the design of the mixers and may also result in higher power consumption.

In an aspect, an LNA with integrated filter may be used to achieve good noise performance and to attenuate interfering signals that may degrade receiver performance. The received signal may be passed directly to the LNA or may be filtered prior to being passed to the LNA. The LNA may be designed to provide the desired noise performance for the receiver. The integrated filter may be designed to provide the desired attenuation of the interfering signals. The LNA with integrated filter may be implemented with various designs, as described below.

Figure 2:
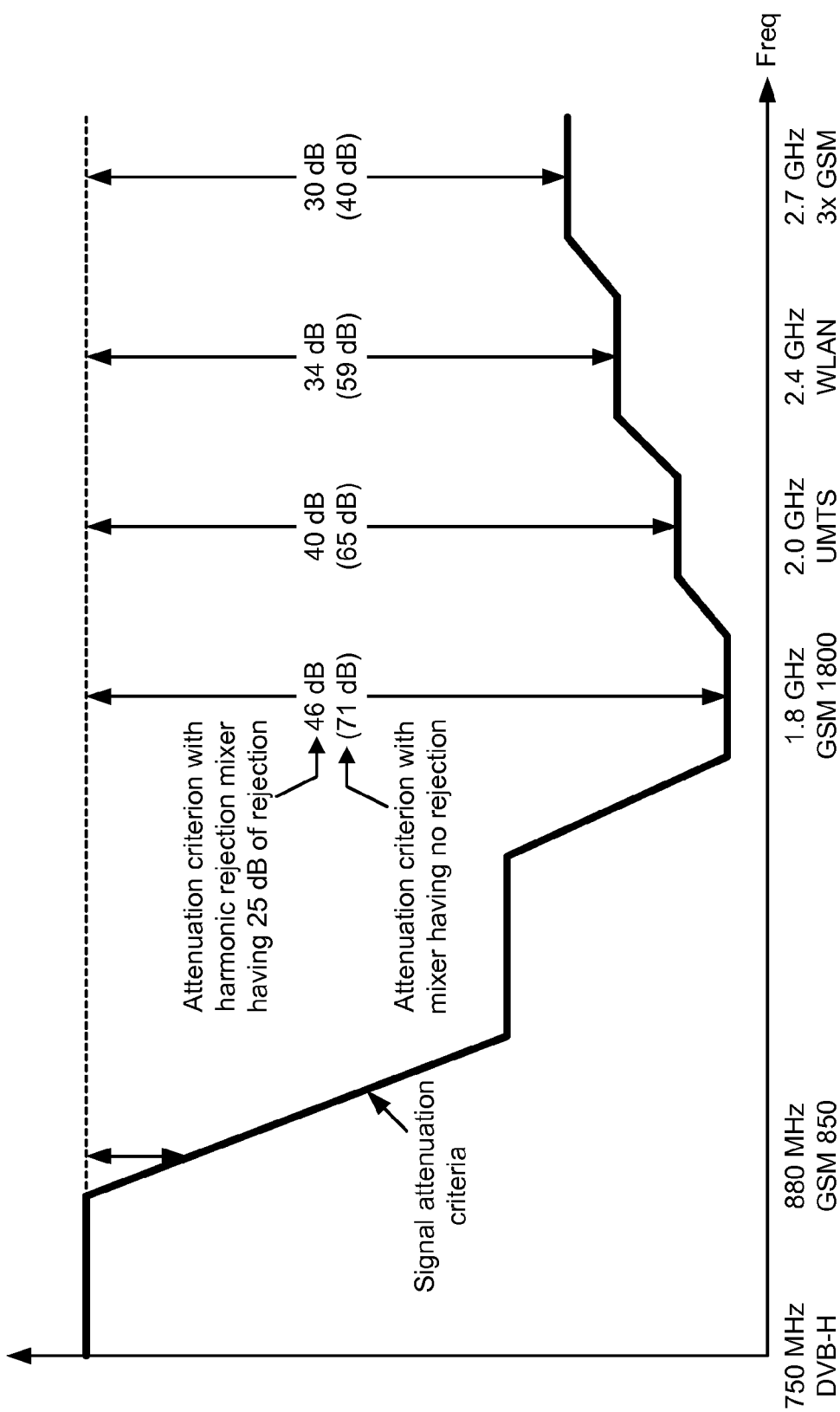
FIG. 2 shows a plot of out-of-band signal attenuation criteria for the receiver.

FIG. 2 shows a plot of out-of-band signal attenuation criteria for receiver 100 when receiving a DVB-H signal. The desired DVB-H signal may be located near 750 MHz. There may be interfering signals in GSM 850 band (around 880 MHz), DCS or GSM 1800 band (around 1.8 GHz), PCS or UMTS band II (around 2 GHz), ISM band (around 2.4 GHz) used for WLANs, third harmonic of GSM 850 band (around 2.7 GHz), etc.

FIG. 2 shows the required amount of attenuation for an interfering signal in each frequency band in accordance with one design. In this design, an interfering signal in GSM 850 band may be attenuated by 6 decibels (dB), an interfering signal in GSM 1800 band may be attenuated by 71 dB, etc. If mixers 140a and 140b are implemented with harmonic rejection mixers that can provide 25 dB of rejection in GSM 1800 band, then an interfering signal in GSM 1800 band may be attenuated by 46 dB instead of 71 dB. The amount of attenuation for each frequency band, with and without harmonic rejection mixers, is given in FIG. 2.

In general, the amount of attenuation for each frequency band may be dependent on various factors such as the desired signal power, the interfering signal power, the amount of loss through unit 112, the amount of antenna isolation between the desired signal and the interfering signal, the difference in conversion gain for the mixers at the fundamental frequency and the harmonic, the required signal-to-noise ratio (SNR) for the desired signal, the desired margin, etc. In any case, an LNA with integrated filter may be used to meet the out-of-band signal attenuation criteria, e.g., the criteria shown in FIG. 2.

Figure 3A:
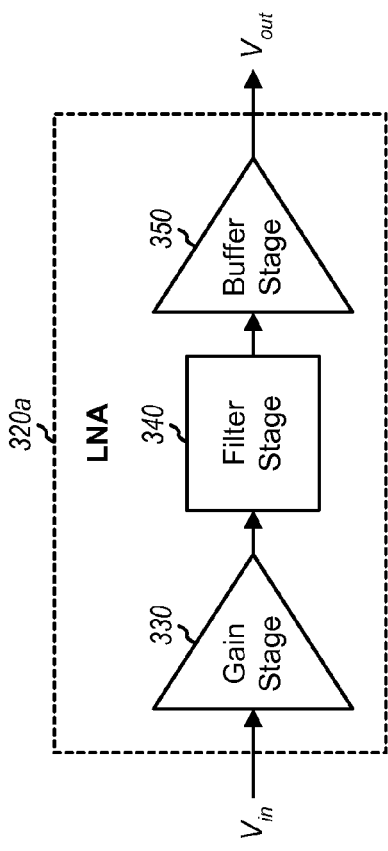
FIG. 3A shows a block diagram of an LNA with one integrated filter stage.

FIG. 3A shows a block diagram of a design of a single-ended LNA 320a with one integrated filter stage. LNA 320a may be used for LNA 120b or 120c in FIG. 1. LNA 320a includes a gain stage 330, a filter stage 340, and a buffer stage 350. Gain stage 330 receives an LNA input signal $V_{in}$ from line $V_{inp}$ or $V_{inm}$, amplifies the LNA input signal with a fixed or variable gain, and provides an amplified signal. Filter stage 340 filters the amplified signal with a filter response and provides a filtered signal. Buffer stage 350 buffers the filtered signal and provides an LNA output signal $V_{out}$ on line $V_{outp}$ or $V_{outm}$.

Figure 3B:
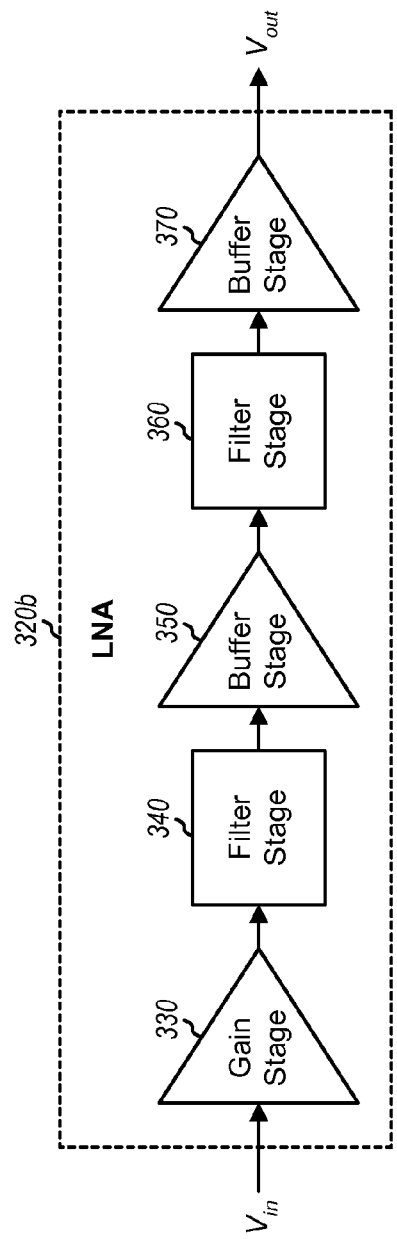
FIG. 3B shows a block diagram of an LNA with two integrated filter stages.

FIG. 3B shows a block diagram of a design of a single-ended LNA 320b with two integrated filter stages. LNA 320b may also be used for LNA 120b or 120c in FIG. 1. LNA 320b includes gain stage 330, first filter stage 340, and first buffer stage 350, which are shown in FIG. 3A. LNA 320b further includes a second filter stage 360 and a second buffer stage 370. Gain stage 330 amplifies the LNA input signal $V_{in}$ and provides the amplified signal. Filter stage 340 filters the amplified signal with a first filter response and provides a first filtered signal. Buffer stage 350 buffers the first filtered signal and provides a buffered signal. Filter stage 360 filters the buffered signal with a second filter response and provides a second filtered signal. Buffer stage 370 buffers the second filtered signal and provides the LNA output signal $V_{out}$.

In general, an LNA may include any number of gain stages, any number of filter stages, any number of buffer stages, and/or other stages. The number of gain stages and filter stages may be dependent on system requirements and/or other considerations such as design complexity, silicon area, power consumption, etc. Each gain stage may provide a fixed gain or a variable gain. Each filter stage may have a suitable filter response. If multiple filter stages are present, then the frequency responses of these filter stages may be determined (i) jointly to achieve a desired overall filter response or (ii) independently for each stage without regard to the other stages. The overall filter response may be an elliptical filter response, a Chebyshev filter response, etc. A buffer stage may be inserted between filter stages, after the last filter stage, etc.

A differential LNA with integrated filter may be implemented in similar manner as a single-ended LNA with integrated filter. Differential circuits may be used for the differential LNA instead of single-ended circuits. For example, a differential LNA with one integrated filter stage may be implemented with a differential gain stage, a differential filter stage, and a differential buffer stage. A differential LNA with two integrated filter stages may be implemented with a differential gain stage, a first differential filter stage, a first differential buffer stage, a second differential filter stage, and a second differential buffer stage.

Figure 4B:
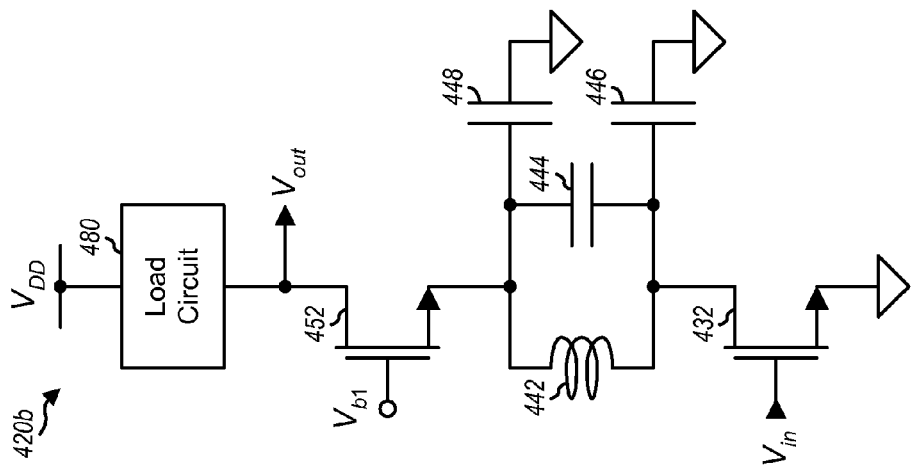
FIG. 4B shows another single-ended LNA with one integrated filter stage.
Figure 4A:
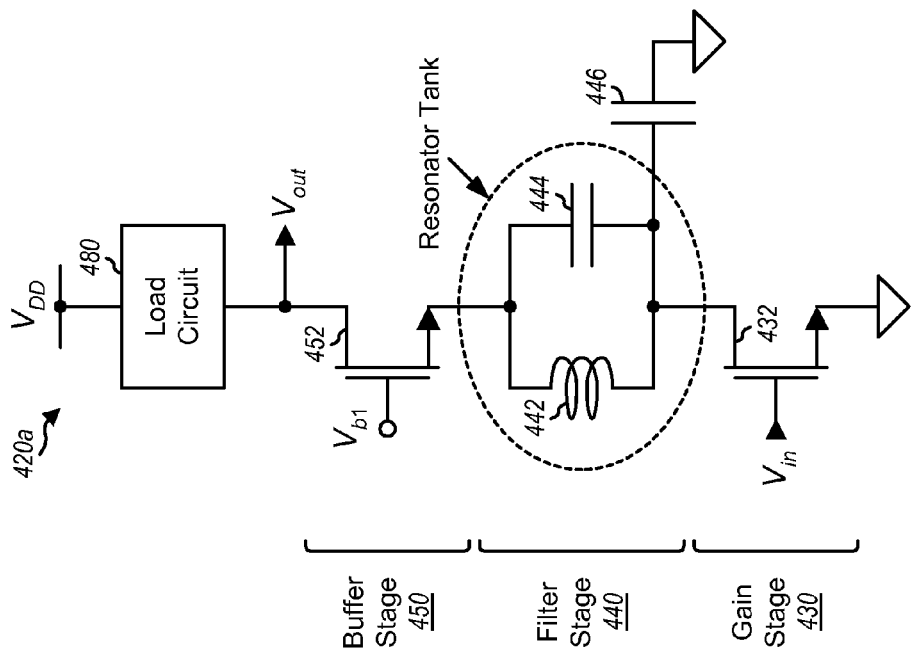
FIG. 4A shows a single-ended LNA with one integrated filter stage.

FIG. 4A shows a schematic diagram of a single-ended LNA 420a with one integrated filter stage. LNA 420a is one design of LNA 320a in FIG. 3A and may be used for LNA 120b or 120c in FIG. 1. LNA 420a includes a gain stage 430, a filter stage 440, a buffer stage 450, and a load circuit 480.

Gain stage 430 includes an N-channel field effect transistor (N-FET) 432 having its source coupled to circuit ground, its gate receiving an LNA input signal $V_{in}$, and its drain providing an amplified signal. Filter stage 440 includes an inductor 442 and capacitors 444 and 446. Inductor 442 has one end coupled to the drain of N-FET 432 and the other end coupled to the source of an N-FET 452 in buffer stage 450. Capacitor 444 is coupled in parallel with inductor 442. Capacitor 446 has one end coupled to the drain of N-FET 432 and the other end coupled to circuit ground. Buffer stage 450 includes N-FET 452 having its gate receiving a bias voltage $V_{b1}$ and its drain providing an LNA output signal $V_{out}$. Load circuit 480 is coupled between the drain of N-FET 452 and a power supply voltage $V_{DD}$.

N-FET 432 provides signal amplification for the input signal $V_{in}$. N-FET 452 provides load isolation for N-FET 432 and drives load circuit 480. Load circuit 480 provides a load for N-FET 452 and may perform other functions such as output impedance matching. Load circuit 480 may include one or more resistors, inductors, capacitors, transistors, etc.

Filter stage 440 provides a desired frequency response for LNA 420a. Inductor 442 and capacitor 444 form a resonator tank. The resonant frequency of this tank may be set at a frequency where the most attenuation is desired, e.g., at approximately 1.8 GHz for the design shown in FIG. 2. The resonator tank provides high impedance at the resonant frequency and low impedance at the desired signal frequencies and other frequencies. Capacitor 446 provides high impedance at the desired signal frequencies and low impedance at high frequencies above the desired signal frequencies. Inductor 442 and capacitors 444 and 446 may be designed to obtain the desired lowpass characteristics for the desired signal as well as the desired stopband characteristics for the interfering signals.

FIG. 4B shows a schematic diagram of a single-ended LNA 420b with one integrated filter stage. LNA 420b is another design of LNA 320a in FIG. 3A and may also be used for LNA 120b or 120c in FIG. 1. LNA 420b includes all of the circuit components in LNA 420a in FIG. 4A. LNA 420b further includes a capacitor 448 having one end coupled to the output of filter stage 440 and the other end coupled to circuit ground. Capacitor 448 provides another low impedance path at high frequencies and improves attenuation of interfering signals.

Figure 4C:
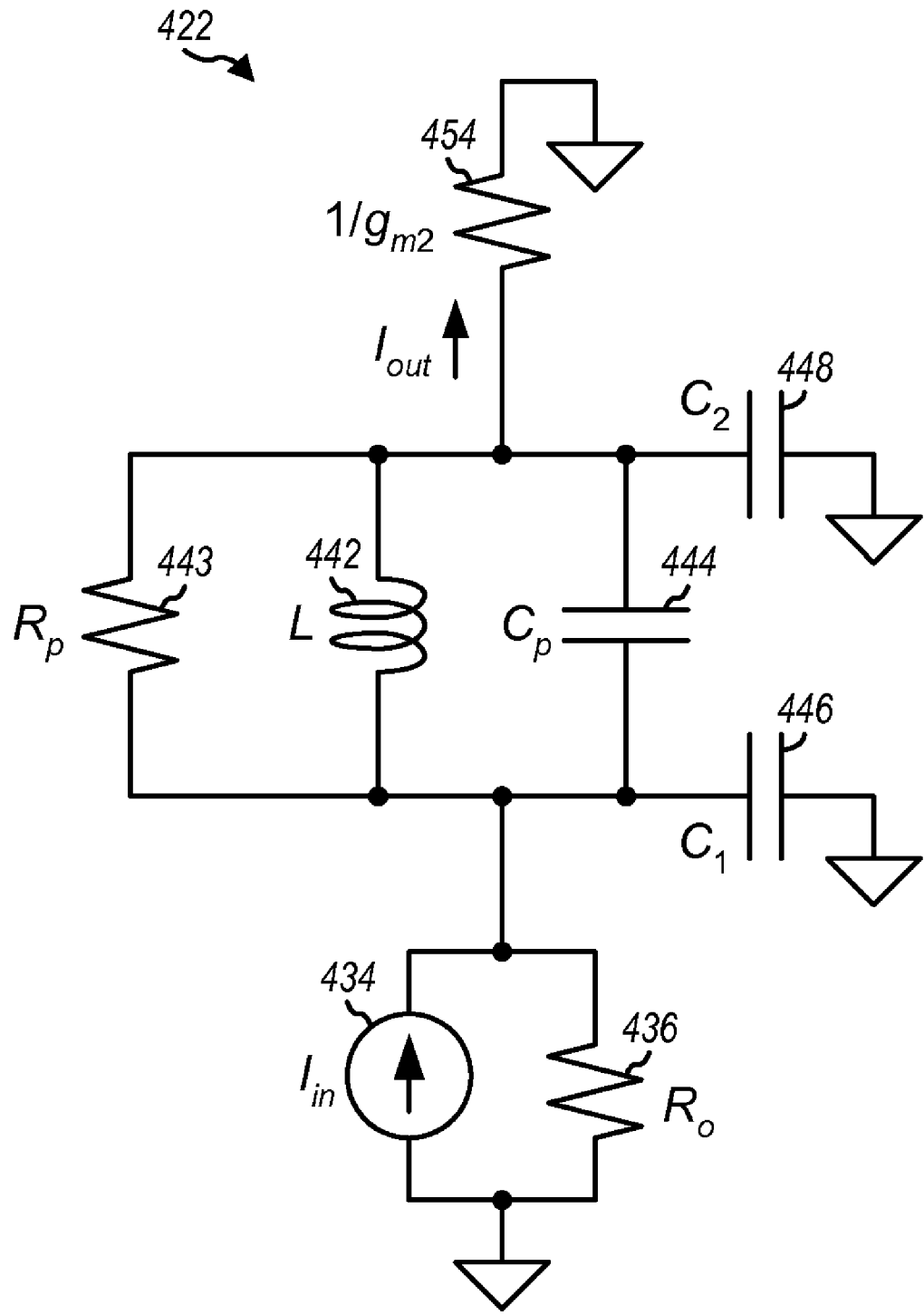
FIG. 4C shows a small-signal model of the LNA in FIG. 4B.

FIG. 4C shows a schematic diagram of a small-signal model 422 of LNA 420b in FIG. 4B. In gain stage 430, N-FET 432 is modeled with a current source 434 and a resistor 436, which are coupled in parallel and between the gain stage output and circuit ground. Resistor 436 has a value of $R_o$, which is the output resistance of N-FET 432. In filter stage 440, inductor 442 is modeled with a resistor 443 coupled in parallel with an ideal inductor. Resistor 443 models the resistive loss of inductor 442 and has a value of $R_p$, which is dependent on the series resistance and quality factor (Q) of inductor 442. Inductor 442 has a value of L, capacitor 446 has a value of $C_1$, and capacitor 448 has a value of $C_2$. In buffer stage 450, N-FET 452 is modeled with a resistor 454 coupled between the filter stage output and circuit ground. Resistor 454 has a value of $R_s = 1/g_{m2}$ where $g_{m2}$ is the transconductance of N-FET 452.

The transfer function H(s) of filter stage 440 may be expressed as:

$$H(s) = \frac{I_{out}(s)}{I_{in}(s)} = \frac{\frac{1}{g_{R_o} + sC_1} \cdot \frac{g_{m2}}{g_{m2} + sC_2}}{\frac{1}{g_{R_o} + sC_1} + Z_T(s) + \frac{1}{g_{m2} + sC_2}}, \quad \text{Eq (1)}$$

where $g_{r_o} = 1/R_o$ is the transconductance of the output resistance of N-FET 432,
$Z_T(s)$ is the impedance of the resonator tank,
$I_{in}(s)$ is the input current to filter stage 440, and
$I_{out}(s)$ is the output current from filter stage 440.

The impedance of the resonator tank may be expressed as:

$$Z_T(s) = \frac{sL}{s^2 LC_p + s\frac{L}{R_p} + 1}. \quad \text{Eq (2)}$$

The 3 dB bandwidth $f_{bw}$ of filter stage 440 may be expressed as:

$$f_{bus} \approx \frac{g_{R_a} - g_{m2}}{2\pi(C_1 - C_2)}. \quad \text{Eq (3)}$$

Figure 11:
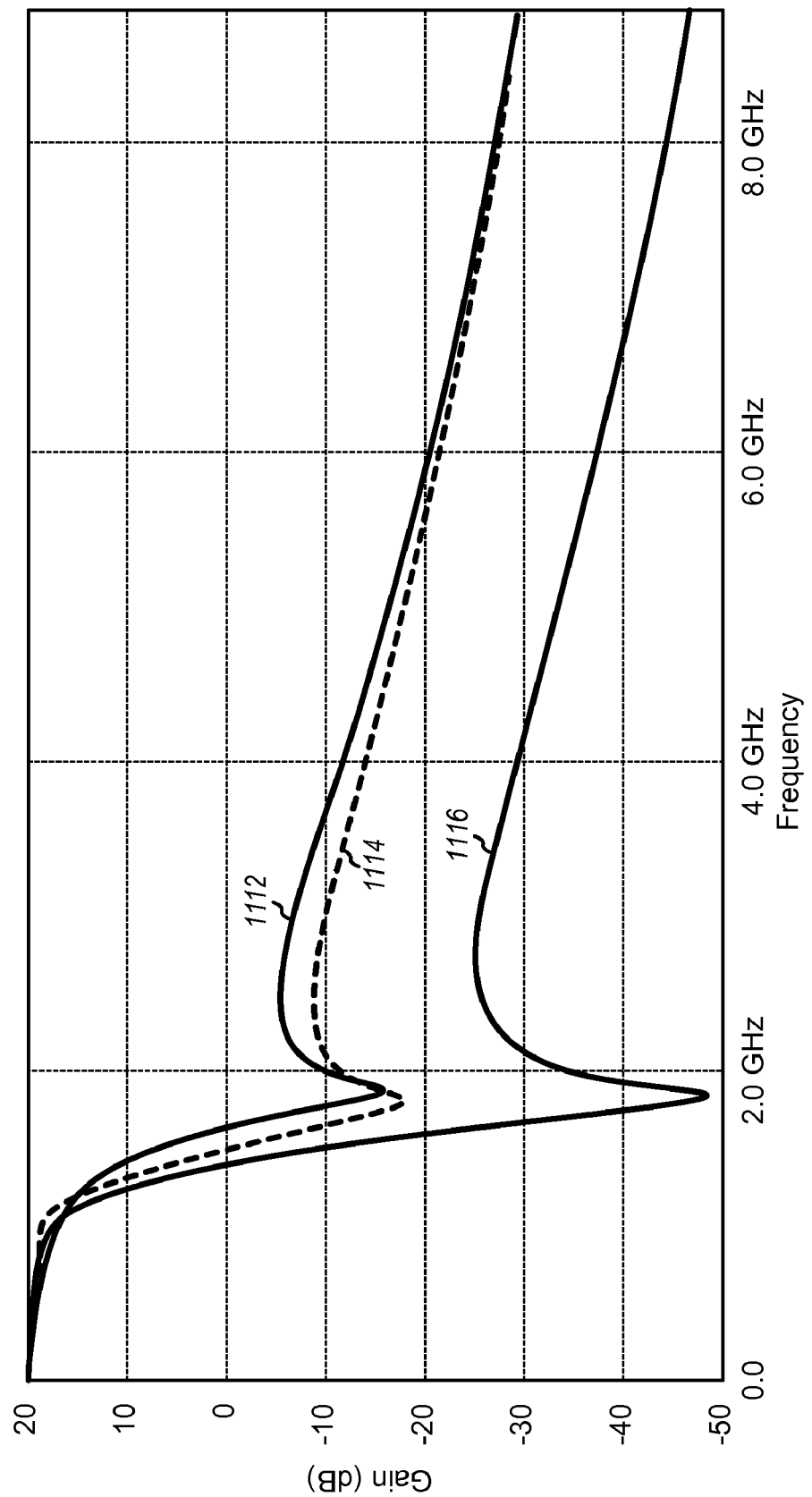
FIG. 11 shows plots of the frequency responses of two filter stages.

FIG. 11 shows a plot 1112 of the frequency response of filter stage 440 in accordance with one design. In this design, filter stage 440 has a bandwidth of around 960 MHz, which is 100 MHz higher than the highest DVB-H frequency in order to reduce the amount of inband gain drop due to IC process variations. Filter stage 440 has a notch at the resonant frequency of the resonator tank. This notch may be located at 1.8 GHz for the design shown in FIG. 2 to achieve high attenuation of the interfering signal at this frequency Referring back to FIG. 4C, the inductance L and capacitance $C_p$ for the resonator tank may be selected based on the desired resonant frequency, which may be 1.8 GHz. Capacitances $C_1$ and $C_2$ provide lowpass filter characteristics. Capacitance $C_1$ may be selected based on the output impedance $R_o$ of N-FET 432. Capacitance $C_2$ may be selected based on the source impedance $R_s = 1/g_{m2}$ of cascode N-FET 452.

Figure 5:
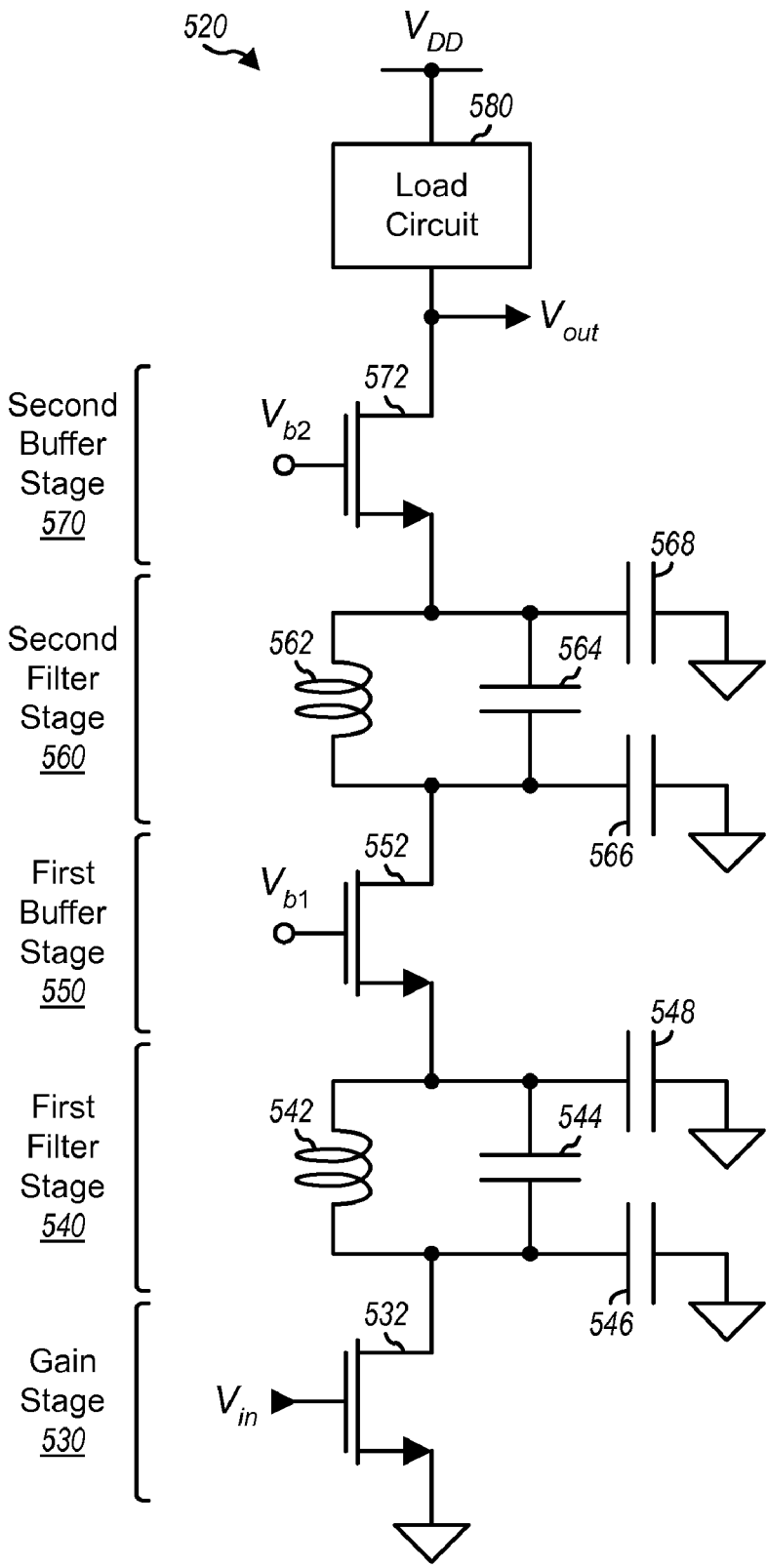
FIG. 5 shows a single-ended LNA with two integrated filter stages.

FIG. 5 shows a schematic diagram of a single-ended LNA 520 with two integrated filter stages. LNA 520 is one design of LNA 320b in FIG. 3B and may be used for LNA 120b or 120c in FIG. 1. LNA 520 includes a gain stage 530, a first filter stage 540, a first buffer stage 550, a second filter stage 560, a second buffer stage 570, and a load circuit 580.

Gain stage 530 includes an N-FET 532, filter stage 540 includes an inductor 542 and capacitors 544, 546 and 548, and buffer stage 550 includes an N-FET 552, all of which are coupled as described above for LNA 420b in FIG. 4B. Filter stage 560 includes an inductor 562 and capacitors 564, 566 and 568. Inductor 562 has one end coupled to the drain of N-FET 552 and the other end coupled to the source of an N-FET 572 in buffer stage 570. Capacitor 564 is coupled in parallel with inductor 562. Capacitor 566 has one end coupled to the drain of N-FET 552 and the other end coupled to circuit ground. Capacitor 568 has one end coupled to the source of N-FET 572 and the other end coupled to circuit ground. Buffer stage 570 includes N-FET 572 having its gate receiving a bias voltage $V_{b2}$ and its drain providing an LNA output signal $V_{out}$. Load circuit 580 is coupled between the drain of N-FET 572 and the supply voltage $V_{DD}$.

N-FET 532 provides signal amplification for an LNA input signal $V_{in}$. N-FET 552 provides buffering. N-FET 572 provides load isolation and drives load circuit 580.

Filter stages 540 and 560 may be designed to provide a desired overall filter response for LNA 520. Inductor 542 and capacitor 544 form a first resonator tank, and inductor 562 and capacitor 564 form a second resonator tank. The resonant frequencies of these two tanks may be set at the same frequency (e.g., 1.8 GHz) to improve attenuation at this frequency. Alternatively, the resonant frequencies of the two tanks may be set at different frequencies (e.g., 1.8 GHz and 2.0 GHz) to achieve good attenuation for both frequencies. The desired overall filter response may be obtained by selecting suitable values for the inductors and capacitors in filter stages 540 and 560.

FIG. 11 shows plots of the frequency responses of filter stages 540 and 560 in accordance with one design. In this design, filter stage 540 has a frequency response shown by plot 1112, and filter stage 560 has a frequency response shown by plot 1114. The overall frequency response for filter stages 540 and 560 is shown by plot 1116. As shown in FIG. 11, out-of-band attenuation may be improved by cascading multiple filter stages.

Each filter stage has a notch due to the resonator tank. The depth of the notch determines the amount of attenuation at the notch frequency. The notch depth is dependent on the Q of the inductor. In general, a deeper notch and a sharper roll-off may be achieved with higher Q for the inductor.

Figure 6:
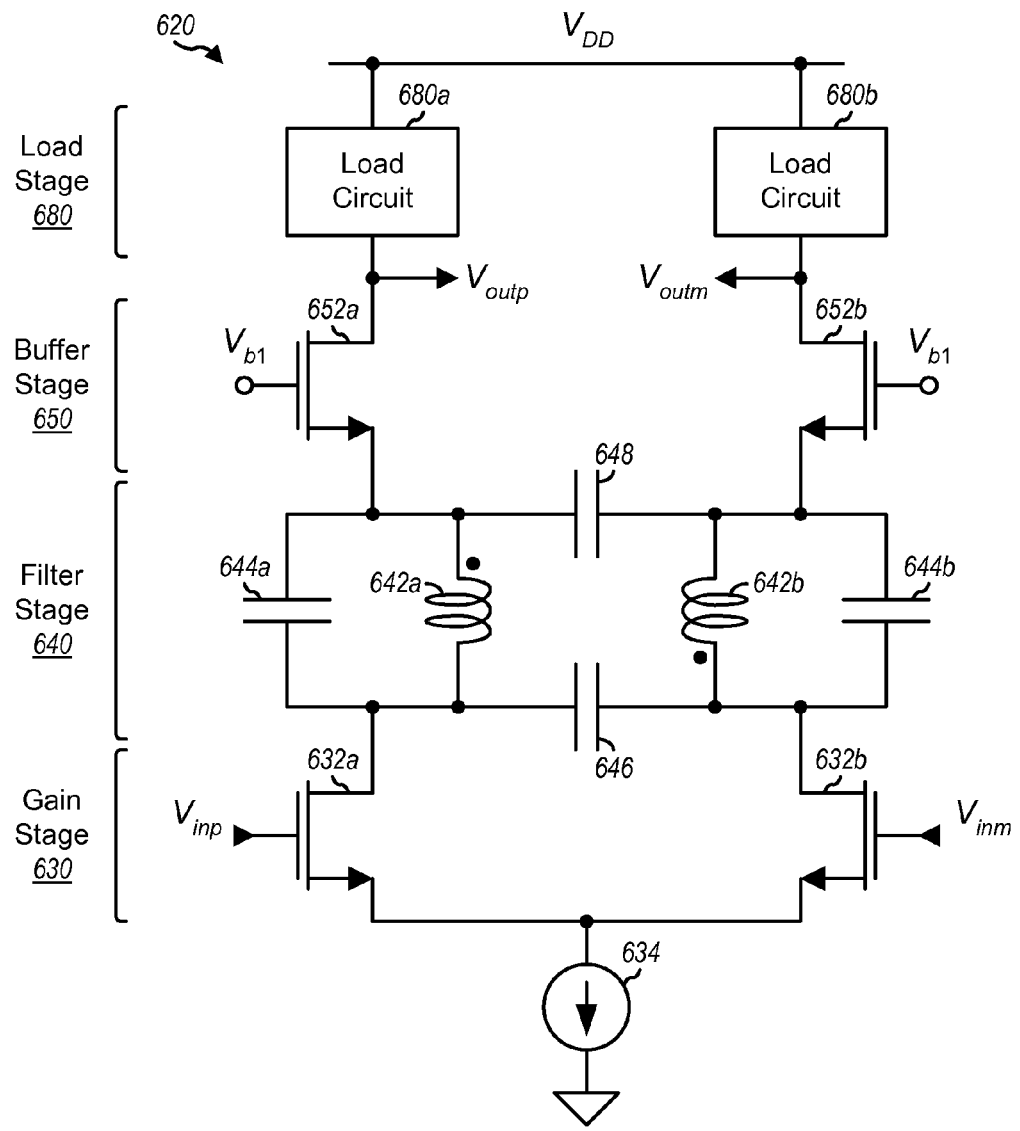
FIG. 6 shows a differential LNA with one integrated filter stage.

FIG. 6 shows a schematic diagram of a differential LNA 620 with one integrated filter stage, which may be used for LNA 120b in FIG. 1. LNA 620 includes a gain stage 630, a filter stage 640, a buffer stage 650, and a load stage 680.

Gain stage 630 includes N-FETs 632a and 632b and a current source 634. N-FETs 632a and 632b have their sources coupled to one end of current source 634 and their gates coupled to lines $V_{inp}$ and $V_{inm}$, respectively. The other end of current source 634 is coupled to circuit ground. The sources of N-FETs 632a and 632b may also be coupled directly to circuit ground, and current source 634 may be omitted.

Filter stage 640 includes inductors 642a and 642b and capacitors 644a, 644b, 646 and 648. Inductor 642a and capacitor 644a are coupled in parallel and form a first resonator tank that is coupled between the drain of N-FET 632a and the source of an N-FET 652a in buffer stage 650. Inductor 642b and capacitor 644b are coupled in parallel and form a second resonator tank that is coupled between the drain of N-FET 632b and the source of an N-FET 652b in buffer stage 650. Capacitor 646 is coupled between the drains of N-FETs 632a and 632b. Capacitor 648 is coupled between the sources of N-FETs 652a and 652b.

Buffer stage 650 includes N-FETs 652a and 652b, which have their gates receiving the bias voltage $V_{b1}$ and their drains coupled to lines $V_{outp}$ and $V_{outm}$, respectively. Load circuits 680a and 680b are coupled between the drains of N-FET 652a and 652b, respectively, and the supply voltage $V_{DD}$.

Gain stage 630, filter stage 640, and buffer stage 650 operate in similar manner as gain stage 430, filter stage 440, and buffer stage 450, respectively, in FIG. 4B. The differential LNA design in FIG. 6 may provide certain advantages such as larger signal swing (which may be desirable to handle large interfering signals), better immunity to common mode noise, improved linearity, reduced effect of parasitic bonding wires used for ground connection, etc.

Figure 7:
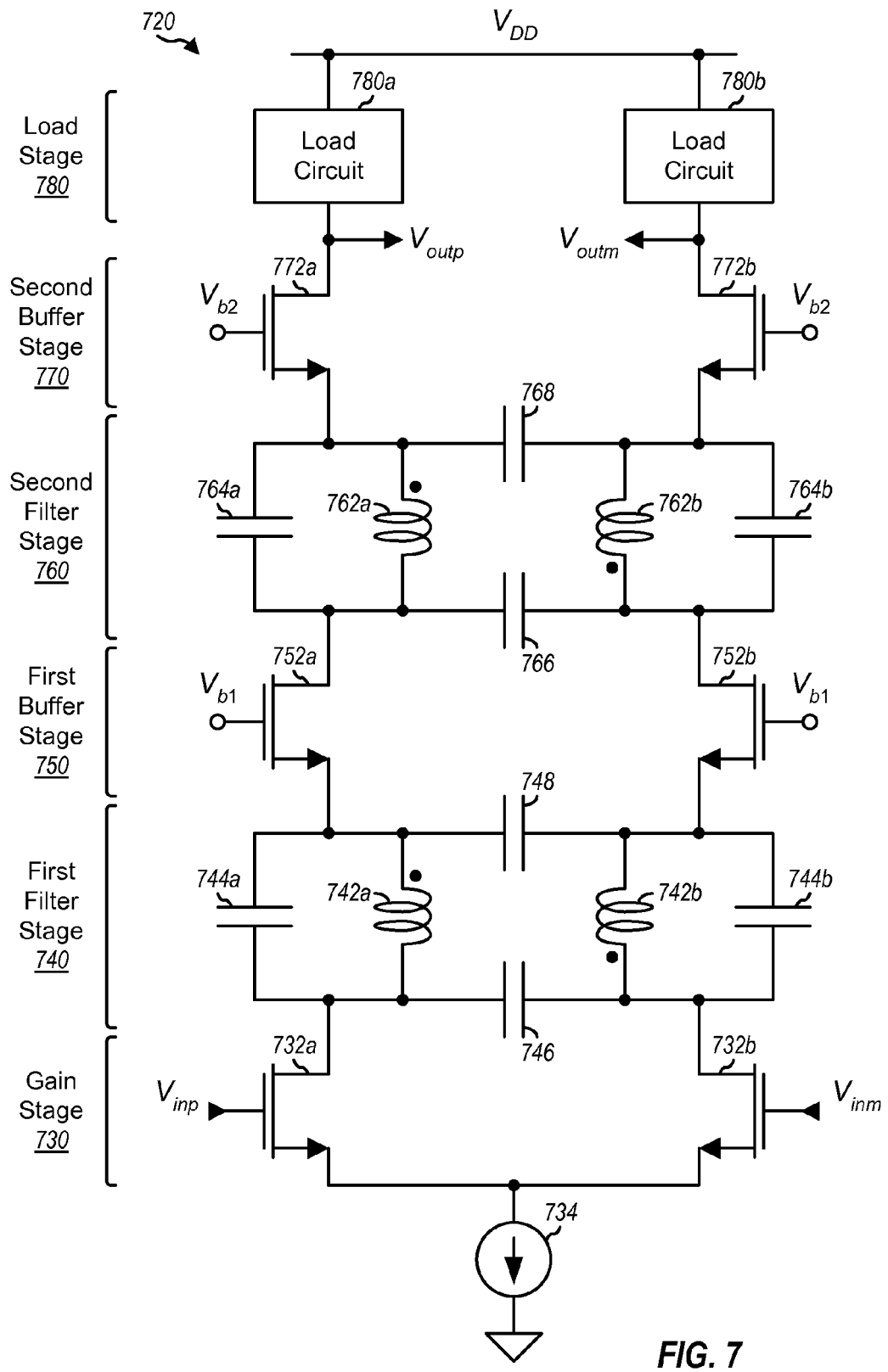
FIG. 7 shows a differential LNA with two integrated filter stages.

FIG. 7 shows a schematic diagram of a differential LNA 720 with two integrated filter stages, which may also be used for LNA 120b in FIG. 1. LNA 720 includes a gain stage 730, a first filter stage 740, a first buffer stage 750, a second filter stage 760, a second buffer stage 770, and a load stage 780.

Gain stage 730 includes N-FETs 732a and 732b and a current source 734. Filter stage 740 includes inductors 742a and 742b and capacitors 744a, 744b, 746 and 748. Buffer stage 750 includes N-FET 752a and 752b. These circuit components are coupled as described above for LNA 620 in FIG. 6. Filter stage 760 includes inductors 762a and 762b and capacitors 764a, 764b, 766 and 768, which are coupled in similar manner as the corresponding inductors and capacitors in filter stage 740. Buffer stage 770 includes N-FETs 772a and 772b, which have their gates receiving the bias voltage $V_{b2}$ and their drains coupled to lines $V_{outp}$ and $V_{outm}$, respectively. Load circuits 780a and 780b are coupled between the drains of N-FET 772a and 772b, respectively, and the supply voltage $V_{DD}$.

Gain stage 730, filter stage 740, buffer stage 750, filter stage 760, buffer stage 770 operate in similar manner as the corresponding gain, filter, and buffer stages in FIG. 5. The differential LNA design in FIG. 7 may provide the advantages noted above for the differential LNA design in FIG. 6.

When multiple inductors are used for one or more filter stages in an LNA, there may be magnetic coupling between these inductors. The magnetic coupling may be more severe when the inductors are fabricated on an RFIC. Furthermore, there may be substrate coupling between the on-chip inductors. The coupling between the inductors may degrade performance, e.g., shift the resonant frequencies, degrade the notch depth, etc.

Figure 8B:
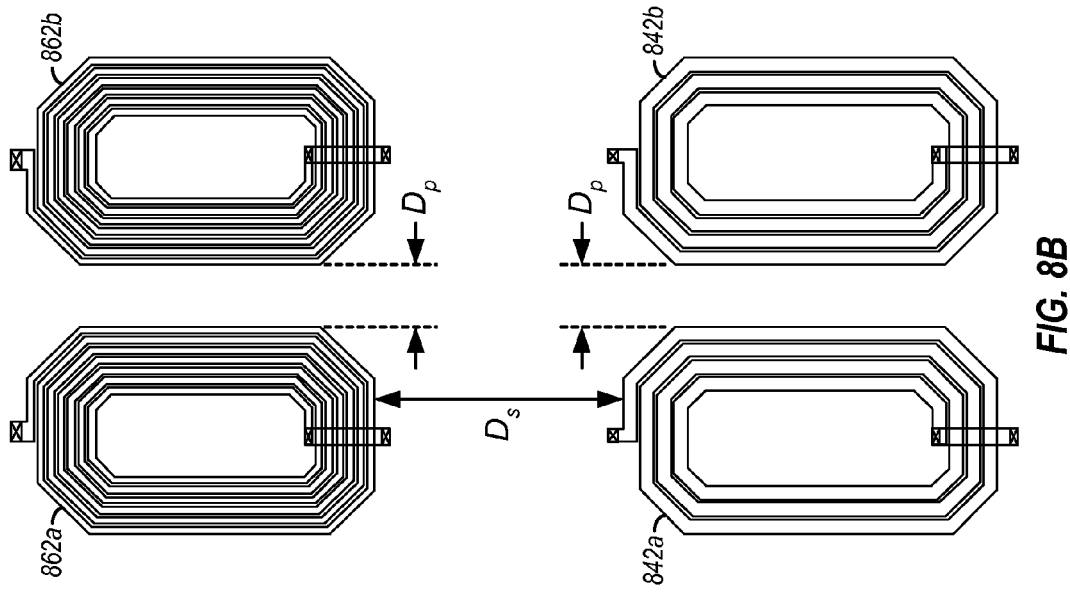
FIG. 8 shows a design of four inductors in the LNA in FIG. 7.
Figure 8A:
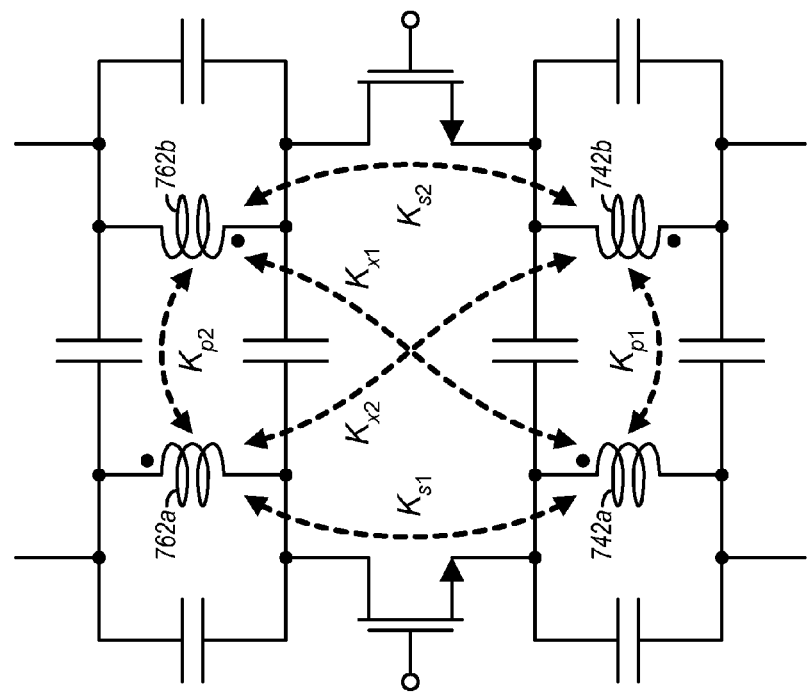

FIG. 8A shows the couplings between the four inductors in LNA 720. Inductors 742a and 742b have a coupling factor of $K_{p1}$, inductors 762a and 762b have a coupling factor of $K_{p2}$, inductors 742a and 762a have a coupling factor of $K_{s1}$, inductors 742b and 762b have a coupling factor of $K_{s2}$, inductors 742a and 762b have a coupling factor of $K_{x1}$, and inductors 742b and 762a have a coupling factor of $K_{x2}$. Coupling factors $K_{p1}$ and $K_{p2}$ may be strong because the layout of differential circuits should be close.

Two inductors may be constructively coupled and have their dots located at the same end of the inductors (not shown in FIG. 7). Two inductors may also be destructively coupled and have their dots located at opposite ends of the two inductors (as shown in FIG. 7 for inductors 742a and 742b and also for inductors 762a and 762b). Constructive coupling for parallel inductors may improve Q, extend the notch depth, and improve rejection. However, constructive coupling may reinforce the magnetic field of other inductors, which may result in greater sensitivity to external coupling. Destructive coupling may cancel the external magnetic field, which may result in less sensitivity to the coupling of other inductors. In one design that is shown in FIGS. 7 and 8A, destructive coupling is used for the parallel inductors in each filter stage in order to reduce sensitivity to external coupling. The coupling between inductors in different filter stages may be reduced by spacing these inductors sufficiently far apart.

FIG. 8B shows a design of inductors 742a, 742b, 762a and 762b within LNA 720 in FIG. 7. In this design, inductors 742a and 742b for filter stage 740 are implemented with spiral inductors 842a and 842b, with inductor 842a spiraling in a clockwise direction and inductor 842b spiraling in a counter-clockwise direction. Destructive coupling achieved by having one inductor rotate in one direction and the other inductor rotate in the other direction. Similarly, inductors 762a and 762b for filter stage 760 are implemented with spiral inductors 862a and 862b, with inductor 862a spiraling in the clockwise direction and inductor 862b spiraling in the counter-clockwise direction.

Inductors 842a and 842b are spaced apart by a distance of $D_p$, and inductors 862a and 862b are also spaced apart by a distance of $D_p$. Inductors 842a and 842b are separated by a distance of $D_s$ from inductors 862a and 862b. In one design, $D_p$ is approximately 40 micrometer (μm), and $D_s$ is approximately 200 micrometer. Other spacing distances may also be used to achieve the desired amount of isolation between inductors. A guard ring may be formed around each inductor to improve isolation.

Inductors 842a and 842b may be designed to obtain the desired inductances and Q for inductors 742a and 742b, respectively. Inductors 862a and 862b may be designed to obtain the desired inductances and Q for inductors 762a and 762b, respectively. For the design criteria shown in FIG. 2, Q may be maximized from 1.5 to 2.4 GHz to achieve good attenuation of the interfering signals in this frequency range.

Although not shown in FIG. 8B, capacitors 744a, 744b, 764a and 764b may be formed inside of inductors 842a, 842b, 862a and 862b, respectively. Each of these capacitors may be implemented with a variable capacitor that may be tuned to account for IC process variation of on-chip capacitor. For each resonator tank, placing the capacitor inside the inductor may reduce the distance between the capacitor and the inductor, which may reduce parasitic inductance and resistance. The capacitor may be implemented with a metal-insulator-metal (MiM) design. Circulating current may be present on a metal plate for the capacitor inside of the inductor and may lower the inductance. This metal plate may be broken up into smaller interconnected plates to reduce the circulating current.

LNAs 120a, 120b and/or 120c in FIG. 1 may have a relatively wide gain range (e.g., around 50 to 60 dB of gain range) in order to handle a wide range of received power for the desired signal as well as potentially large interfering signals. Multiple gain modes may be used to support a wide gain range, with each gain mode covering a portion of the entire gain range. For example, six gain modes may be used to support a gain range of 60 dB, with each gain mode covering approximately 10 dB. Adjacent gain modes may overlap to provide continuous gain coverage.

Figure 9:
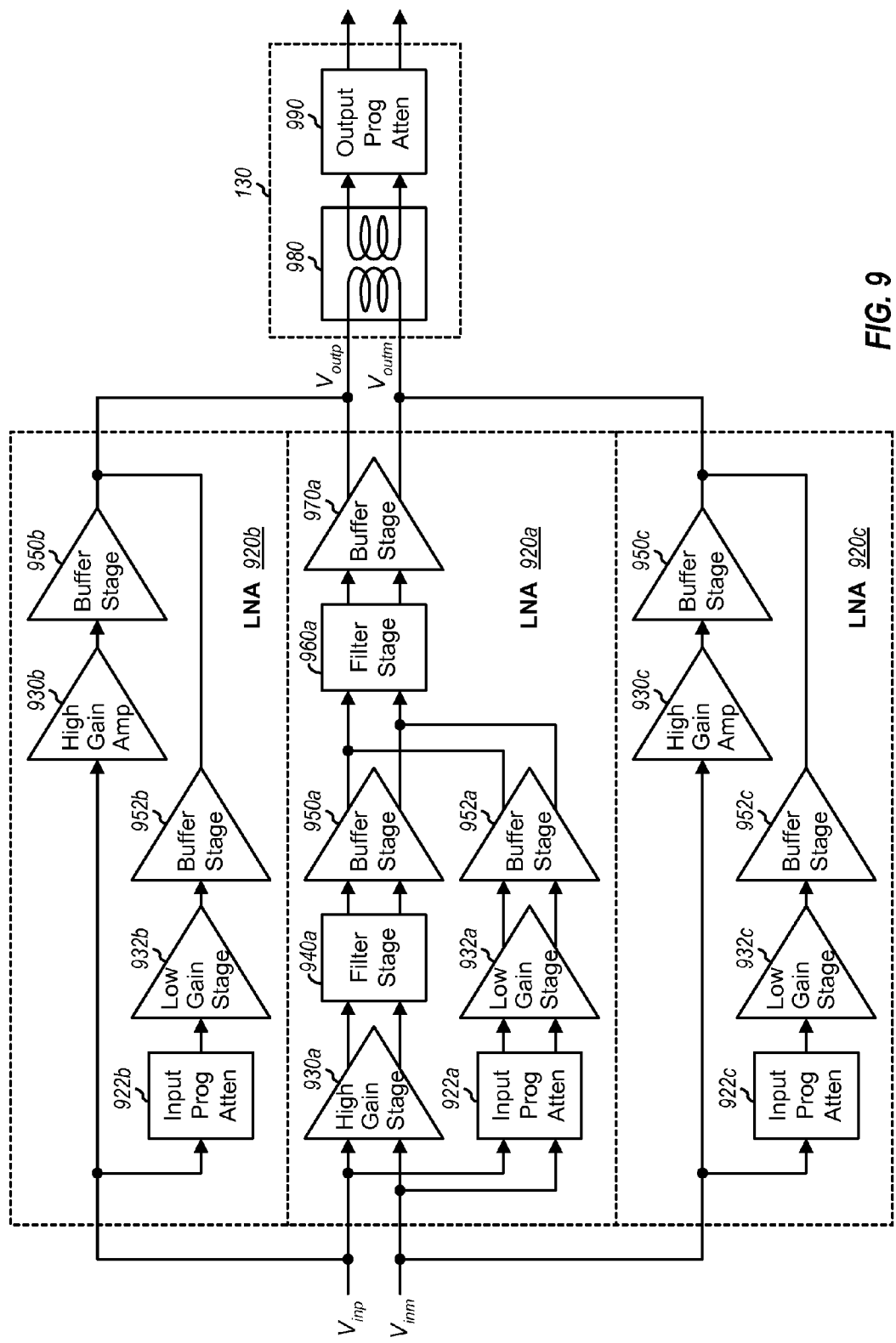
FIG. 9 shows a block diagram of three LNAs with multiple gain modes.

FIG. 9 shows a block diagram of a design of LNAs 920a, 920b and 920c with multiple gain modes. LNAs 920a, 920b and 920c may be used for LNAs 120a, 120b and 120c, respectively, in FIG. 1. In this design, LNA 920a includes two integrated filter stages whereas LNAs 920b and 920c do not include an integrated filter. In general, each LNA may or may not include an integrated filter, depending on system requirements and/or other considerations.

In the design shown in FIG. 9, LNA 920a includes a high gain stage 930a, a first filter stage 940a, a first buffer stage 950a, a second filter stage 960a, a second buffer stage 970a, an input programmable attenuator 922a, a low gain stage 932a, and a buffer stage 952a. Stages 930a, 940a and 950a are for a high gain path. Stages 922a, 932a and 952a are for a low gain path. Stages 960a and 970a are common for both the high and low gain paths.

If LNA 920a is enabled, then either gain stage 930a or 932a may be selected for use depending on the desired gain for LNA 920a. If enabled, high gain stage 930a amplifies a differential LNA input signal on lines $V_{inp}$ and $V_{inm}$ with a fixed high gain and provides a first amplified signal. This amplified signal is filtered by filter stage 940a, buffered by buffer stage 950a, and provided to filter stage 960a. Attenuator 922a attenuates the differential LNA input signal and provides an attenuated signal to low gain stage 932a. If enabled, low gain stage 932a amplifies the attenuated signal with a fixed low gain and provides a second amplified signal to filter stage 960a. Filter stage 960a filters its input signal and provides a filtered signal. Buffer stage 970a buffers the filtered signal and provides a differential LNA output signal on lines $V_{outp}$ and $V_{outm}$.

LNA 920b includes an input programmable attenuator 922b, a low gain stage 932b, a high gain stage 930b, and buffer stages 950b and 952b. If LNA 920b is enabled, then either gain stage 930b or 932b may be selected for use depending on the desired gain for LNA 920b. If enabled, high gain stage 930b amplifies an LNA input signal on line $V_{inp}$ with a fixed high gain. Buffer stage 950b buffers the amplified signal from high gain stage 930b and provides an LNA output signal on line $V_{outp}$. Attenuator 922b attenuates the LNA input signal and provides an attenuated signal to low gain stage 932b. If enabled, low gain stage 932b amplifies the attenuated signal with a fixed low gain. Buffer stage 952b buffers the amplified signal from low gain stage 932b and provides an LNA output signal on line $V_{outp}$.

LNA 920c includes an input programmable attenuator 922c, a low gain stage 932c, a high gain stage 930c, and buffer stages 950c and 952c that are coupled and operated in similar manner as attenuator 922b, gain stages 930b and 932b, and buffer stages 950b and 952b in LNA 920b.

FIG. 9 also shows a design of output stage 130 in FIG. 1. In this design, output stage 130 includes a balun 980 and an output programmable attenuator 990. Balun 990 has two inputs coupled to lines $V_{outp}$ and $V_{outm}$ and two outputs coupled to attenuator 990. Balun 980 performs single-ended to differential conversion of the output signals from LNAs 920b and 920c and may also perform bandpass filtering. Attenuator 990 attenuates the signal from balun 980 and provides a differential output signal for output stage 130. Output stage 130 may also include one or more amplifiers, buffers, filters, etc. Output stage 130 may be considered as an LNA portion that is common to LNAs 920a, 920b and 920c.

In one design, LNA 920a has six gain modes and an overall gain range of approximately 60 dB. High gain stage 930a and output programmable attenuator 990 may be used for the three highest gain modes, which may cover a gain range of approximately +24 to −6 dB. Low gain stage 932a and input programmable attenuator 922a may be used for the three lowest gain modes, which may cover a gain range of approximately −6 to −36 dB. In general, each of LNAs 920a, 920b and 920c may have any number of gain modes and any overall gain range. The three LNAs may have the same or different numbers of gain modes, and the same or different overall gain ranges. For each LNA, the low gain stage may be biased with less current than the high gain stage in order to reduce power consumption.

In the design shown in FIG. 9, attenuator 922 may be used at the front of each LNA 920 to combat large interfering signals. Each attenuator 922 may be implemented with a resistor ladder, a voltage divider network, etc. The use of attenuators 922 and 990 and gain stages 930 and 932 allows each LNA 920 to achieve a wide gain range.

FIG. 9 shows an example design of LNA 920a with multiple gain modes and integrated filter. In general, an LNA may include any number of gain stages, filter stages, buffer stages, attenuators, etc., which may be arranged differently from the configuration shown in FIG. 9. For example, multiple gain stages may be coupled in cascaded, and each gain stage may be bypassed when not selected. An LNA may also include other circuit blocks.

Figure 10:
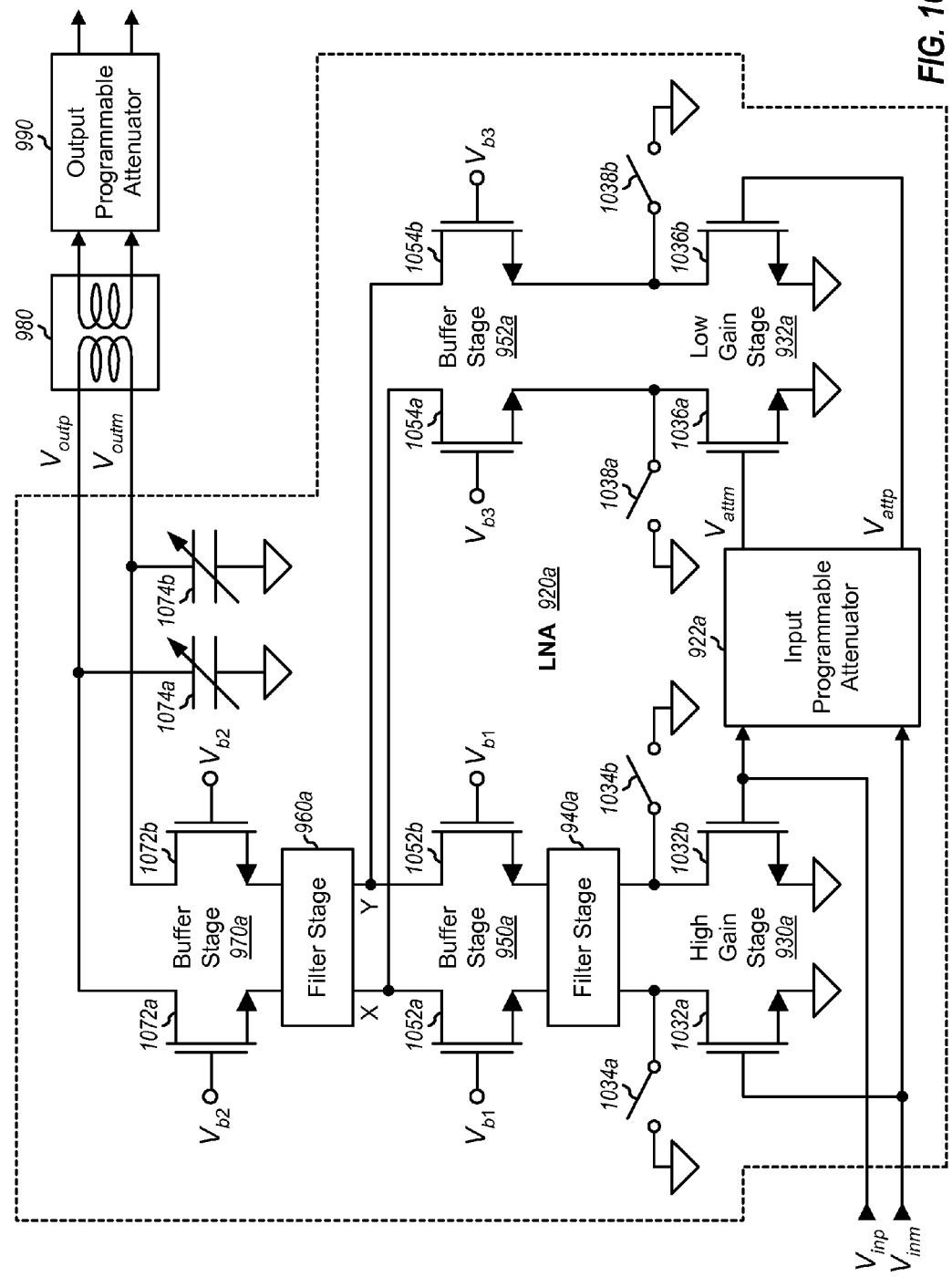
FIG. 10 shows a differential LNA with integrated filter and multiple gain modes.

FIG. 10 shows a schematic diagram of a design of LNA 920a in FIG. 9. Within LNA 920a, high gain stage 930a includes N-FETs 1032a and 1032b having their sources coupled to circuit ground, their gates coupled to lines $V_{inm}$ and $V_{inp}$, respectively, and their drains coupled to a differential input of filter stage 940a. Isolation switches 1034a and 1034b have one end coupled to the drains of N-FETs 1032a and 1032b, respectively, and the other end coupled to circuit ground. Buffer stage 950a includes N-FETs 1052a and 1052b having their sources coupled to a differential output of filter stage 940a, their gates receiving the bias voltage $V_{b1}$, and their drains coupled to a differential input of filter stage 960a. Buffer stage 970a includes N-FETs 1072a and 1072b having their sources coupled to a differential output of filter stage 960a, their gates receiving the bias voltage $V_{b2}$, and their drains coupled to lines $V_{outp}$ and $V_{outm}$, respectively, Low gain stage 932a includes N-FETs 1036a and 1036b having their sources coupled to circuit ground and their gates receiving the attenuated signal from attenuator 922a. Isolation switches 1038a and 1038b have one end coupled to the drains of N-FETs 1036a and 1036b, respectively, and the other end coupled to circuit ground. Buffer stage 952a includes N-FETs 1054a and 1054b having their sources coupled to the drains of N-FETs 1036a and 1036b, respectively, their gates receiving a bias voltage $V_{b3}$, and their drains coupled to the differential input of filter stage 960a.

Filter stages 940a and 960a may each be implemented with a resonator tank and one or two shunt capacitors, e.g., as shown in FIG. 6 or 7. Capacitors 1074a and 1074b are coupled between lines $V_{outp}$ and $V_{outm}$, respectively, and circuit ground. Capacitors 1074a and 1074b and balun 980 may provide filtering for DVB-H.

When low gain mode is selected for LNA 920a, N-FETs 1036a and 1036b in low gain stage 932a and N-FETs 1054a and 1054b in buffer stage 952a may be turned on. Isolation switches 1038a and 1038b may be opened to allow low gain stage 932a to operate. N-FETs 1032a and 1032b in high gain stage 930a and N-FETs 1052a and 1052b in buffer stage 950a may be turned off. However, there may be leakage paths through parasitic gate-to-drain capacitance $C_{gd}$ of N-FETs 1032a and 1032b and parasitic source-to-drain capacitance $C_{ds}$ of N-FETs 1052a and 1052b. Isolation switches 1034a and 1034b may be closed to short out any leakage signals to circuit ground and provide good isolation from high gain stage 930a.

When high gain mode is selected, the N-FETs in high gain stage 930a and buffer stage 950a may be turned on, and the N-FETs in low gain stage 932a and buffer stage 952a may be turned off. Isolation switches 1034a and 1034b may be opened, and isolation switches 1038a and 1038b may be closed to provide good isolation from low gain stage 932a. Isolation switches 1038a and 1038b may be omitted if turning off the N-FETs in low gain stage 932a and buffer stage 952a can provide sufficient isolation in the high gain mode.

In general, an amplifier with integrated filter may include a gain stage and a filter stage. The gain stage may provide signal amplification for an input signal. The filter stage may be coupled to the gain stage and may provide filtering for the input signal to attenuate interfering/undesired signals. The amplifier may further include a buffer stage coupled to the filter stage. The buffer stage may buffer a filtered signal from the filter stage. The gain stage, filter stage, and buffer stage may be stacked and coupled between a supply voltage and circuit ground, e.g., as shown in FIGS. 4A, 4B and 6.

The amplifier may further include a second filter stage and a second buffer stage. The second filter stage may be coupled to the buffer stage and may provide additional filtering for the input signal to further attenuate the interfering signals. The second buffer stage may be coupled to the second filter stage and may buffer a second filtered signal from the second filter stage. All of the stages may be stacked and coupled between the supply voltage and circuit ground, e.g., as shown in FIGS. 5 and 7.

The filter stage(s) may implement an elliptical lowpass filter or some other type of filter. Each filter stage may include an inductor and a capacitor, which may be coupled in parallel to form a resonator tank. The resonator tank may pass a desired signal and attenuate the interfering signals near the resonant frequency. The amplifier may have a largest signal attenuation criterion at a particular frequency (e.g., 1.8 GHz), and the resonator tank may provide a notch near this frequency. Each filter stage may further include a shunt capacitor coupled to one end (or each end) of the inductor. Each shunt capacitor may form a low impedance path at high frequencies.

For a differential design, one resonator tank may be coupled to an inverting output of the gain stage, and another resonator tank may be coupled to a non-inverting output of the gain stage. A capacitor may be coupled between one end (or each end) of the two resonator tanks. The inductors in the two resonator tanks may be formed to achieve destructive coupling. For example, one inductor may be implemented with a first spiral inductor in a clockwise direction, and the other inductor may be implemented with a second spiral inductor in a counter-clockwise direction.

The amplifier with integrated filter may be an LNA or some other type of amplifier. The input signal may be a broadcast signal for DVB-H, ISDB-T, MediaFLO™, etc. The input signal may also be for a wireless communication system such as CDMA2000, UMTS, GSM, etc.

An amplifier with integrated filter (e.g., an LNA) may also have multiple gain paths. A first gain path may include a first gain stage, a first filter stage, and a first buffer stage. The first gain stage may provide signal amplification (e.g., high gain) for an input signal and may output a first amplified signal when enabled. The first filter stage may be coupled to the first gain stage and may provide filtering for the first amplified signal. The first buffer stage may be coupled to the first filter stage and may buffer a filtered signal from the first filter stage. The first gain stage may include one or more switches coupled between an internal node of the first gain stage and AC ground and used to isolate the first gain stage when disabled.

A second gain path may include a second gain stage and a second buffer stage. The second gain stage may provide signal amplification (e.g., low gain) for the input signal and may output a second amplified signal when enabled. The second buffer stage may be coupled to the second gain stage and may buffer the second amplified signal. The second gain path may further include an attenuator, which may attenuate the input signal and provide an attenuated signal to the second gain stage.

The amplifier may further include a second filter stage and a third buffer stage. The second filter stage may be coupled to the first and second buffer stages and may provide filtering for the first or second amplified signal. The third buffer stage may be coupled to the second filter stage and may buffer a second filtered signal from the second filter stage.

Various designs of an amplifier with integrated filter have been described above. The amplifier may be used for various applications such as communication, networking, computing, consumer electronics, etc. The amplifier may be used for broadcast receivers, cellular phones, PDAs, wireless devices, handheld devices, wireless modems, laptop computers, cordless phones, etc. The amplifier may also be used for various communication systems such as CDMA2000 systems, Wideband-CDMA (W-CDMA) systems, GSM systems, WLANs, broadcast systems, etc. The amplifier may also be used for Bluetooth devices, Global Positioning System (GPS) receivers, etc.

The amplifier with integrated filter described herein may be implemented within an IC, an RFIC, a mixed-signal IC, an ASIC, a printed circuit board (PCB), an electronics device, etc. The amplifier may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), etc.

An apparatus implementing the amplifier with integrated filter described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:
1. An integrated circuit comprising:
an amplifier configured to receive an input signal and provide an output signal, the amplifier comprising:

a gain stage including a transistor configured to receive the input signal at a gate and provide signal amplification for the input signal;

a filter stage stacked and coupled to the gain stage between a supply voltage and circuit ground in a common integrated circuit and configured to provide notch filtering for the input signal and generate an output signal; and a buffer stage coupled between a load stage and the filter stage and configured to buffer a filtered signal from the filter stage.

2. The integrated circuit of claim 1, wherein the gain stage, the filter stage, and the buffer stage are stacked and coupled between a supply voltage and circuit ground.

3. The integrated circuit of claim 1, wherein the amplifier further comprises a second filter stage coupled to the buffer stage and configured to provide additional filtering for the input signal.

4. The integrated circuit of claim 3, wherein the filter stage and the second filter stage form an elliptical lowpass filter.

5. The integrated circuit of claim 3, wherein the amplifier further comprises a second buffer stage coupled to the second filter stage and configured to buffer a second filtered signal from the second filter stage.

6. The integrated circuit of claim 5, wherein the gain stage, the filter stage, the buffer stage, the second filter stage, and the second buffer stage are stacked and coupled between a supply voltage and circuit ground.

7. The integrated circuit of claim 1, wherein the gain stage comprises a transistor configured to amplify the input signal and drive the filter stage.

8. The integrated circuit of claim 1, wherein the filter stage comprises an inductor coupled to an output of the gain stage, and a first capacitor coupled in parallel with the inductor, the inductor and the first capacitor forming a resonator tank for passing a desired signal and attenuating interfering signals near a resonant frequency of the resonator tank.

9. The integrated circuit of claim 8, wherein the filter stage further comprises a second capacitor coupled to a first end of the inductor and forming a low impedance path at high frequencies.

10. The integrated circuit of claim 9, wherein the filter stage further comprises a third capacitor coupled to a second end of the inductor and forming a second low impedance path at high frequencies.

11. The integrated circuit of claim 8, wherein the amplifier has a largest signal attenuation criterion at a particular frequency, and wherein the resonator tank provides a notch near the particular frequency.

12. The integrated circuit of claim 1, wherein the gain stage is configured to provide an inverting output and a non-inverting output, and wherein the filter stage comprises a first inductor and a first capacitor coupled in parallel and to the inverting output of the gain stage, and a second inductor and a second capacitor coupled in parallel and to the non-inverting output of the gain stage.

13. The integrated circuit of claim 12, wherein the filter stage further comprises a third capacitor coupled between the inverting and non-inverting outputs of the gain stage.

14. The integrated circuit of claim 12, wherein the first and second inductors are formed to achieve destructive coupling.

15. The integrated circuit of claim 12, wherein the first inductor is implemented with a first spiral inductor in a clockwise direction and the second inductor is implemented with a second spiral inductor in a counter-clockwise direction.

16. The integrated circuit of claim 1, wherein the gain stage is configured to amplify a broadcast signal for Digital Video Broadcasting for Handhelds (DVB-H), Integrated Services Digital Broadcasting for Terrestrial Television Broadcasting (ISDB-T), or MediaFLO™.

17. An apparatus comprising:

an amplifier configured to receive an input signal and provide an output signal, the amplifier comprising:

a gain stage including a transistor configured to receive the input signal at a gate and provide signal amplification for the input signal;

a filter stage stacked and coupled to the gain stage between a supply voltage and circuit ground in a common integrated circuit and configured to provide notch filtering for the input signal and generate an output signal; and a buffer stage coupled between a load stage and the filter stage and configured to buffer a filtered signal from the filter stage.

18. The apparatus of claim 17, wherein the gain stage, the filter stage, and the buffer stage are stacked and coupled between a supply voltage and circuit ground.

19. A method comprising:

amplifying an input signal with a gain stage including a transistor configured to receive the input signal at a gate to obtain an amplified signal;

filtering the amplified signal with a filter stage stacked and coupled to the gain stage between a supply voltage and circuit ground in a common integrated circuit to generage an output signal, the gain stage and the filter stage being part of an amplifier with integrated filter; and buffering the filtered signal with a buffer stage coupled between a load stage and the filter stage to obtain a buffered signal, the buffer stage being part of the amplifier with integrated filter.

20. An apparatus comprising:

means for amplifying an input signal with a gain stage including a transistor configured to receive the input signal at a gate to obtain an amplified signal;

means for filtering the amplified signal with a filter stage stacked and coupled to the gain stage between a supply voltage and circuit ground in a common integrated circuit to generate an output signal, the gain stage and the filter stage being part of an amplifier with integrated filter; and means for buffering the filtered signal with a buffer stage coupled between a load stage and the filter stage to obtain a buffered signal, the means for buffering being part of the amplifier with integrated filter.

* * * * *